United States Patent
Fujii

[11] Patent Number: 5,946,578
[45] Date of Patent: Aug. 31, 1999

[54] METHOD OF FABRICATING SEMICONDUCTOR DEVICE HAVING SOURCE/DRAIN LAYER RAISED FROM SUBSTRATE SURFACE

[75] Inventor: Kunihiro Fujii, Tokyo, Japan

[73] Assignee: NEC Corporation, Tokyo, Japan

[21] Appl. No.: 09/015,490

[22] Filed: Jan. 28, 1998

[30] Foreign Application Priority Data

Jan. 30, 1997 [JP] Japan ................................ 9-016190

[51] Int. Cl.$^6$ ................................ H01L 21/336
[52] U.S. Cl. .................. 438/300; 438/305; 438/564; 438/592; 438/595
[58] Field of Search ................................ 438/300, 299, 438/301, 303, 305, 306, 307, 532, 558, 564, 595, 592; 430/FOR 174, FOR 185

[56] References Cited

U.S. PATENT DOCUMENTS

| 5,079,180 | 1/1992 | Rodder et al. ........................ 438/300 |
| 5,200,352 | 4/1993 | Pfiester ................................ 438/305 |
| 5,371,026 | 12/1994 | Hayden et al. ..................... 438/300 |
| 5,677,214 | 10/1997 | Hsu ..................................... 438/305 |
| 5,691,212 | 11/1997 | Tsai et al. .......................... 438/300 |
| 5,710,450 | 1/1998 | Chau et al. ........................ 438/300 |
| 5,733,792 | 3/1998 | Masuoka ............................ 438/300 |
| 5,824,586 | 10/1998 | Wollesen et al. ................... 438/300 |
| 5,879,997 | 3/1999 | Lee et al. ........................... 438/301 |

FOREIGN PATENT DOCUMENTS 2-222153  9/1990  Japan .

*Primary Examiner*—Michael Trinh
*Attorney, Agent, or Firm*—Foley, Hoag & Eliot LLP

[57] ABSTRACT

An oxide film is deposited on a semiconductor substrate on which a field oxide film and a gate electrode are formed. The oxide film is etched back to form a first sidewall insulating film made of the oxide film on a side surface of the gate electrode. Then a silicon film is selectively grown on the gate electrode and on the semiconductor substrate. Thereafter a thermal oxide film is formed on a surface of the silicon film by thermally oxidizing. In the step of thermal oxidation, a thin silicon film deposited on a part of the first sidewall insulating film and a part of the field oxide film is fully oxidized. Thereafter, the thermal oxide film is etched back and thereby a second sidewall insulating film made of the thermal oxide film is formed on a side surface of the silicon film.

29 Claims, 3 Drawing Sheets

FIG. IA (PRIOR ART)
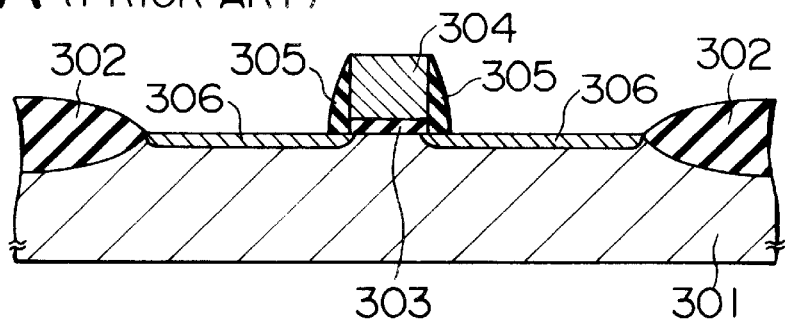
FIG. IB (PRIOR ART)
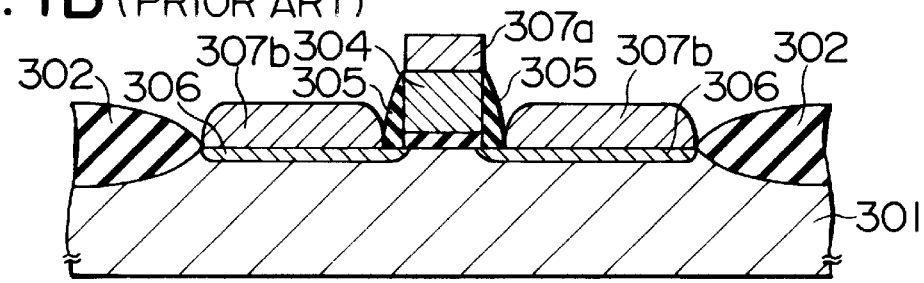
FIG. IC (PRIOR ART)
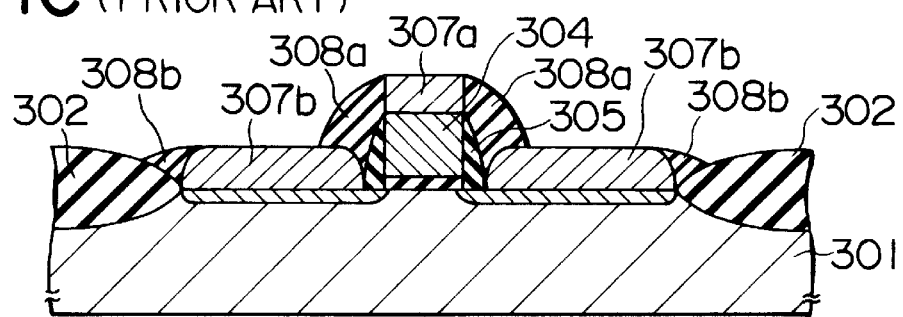
FIG. ID (PRIOR ART)
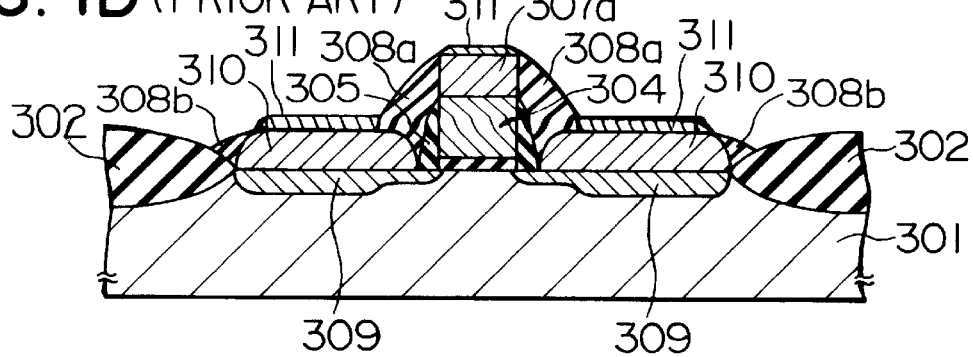

METHOD OF FABRICATING SEMICONDUCTOR DEVICE HAVING SOURCE/DRAIN LAYER RAISED FROM SUBSTRATE SURFACE

BACKGROUND OF THE INVENTION

1. Field of the Invention

The present invention relates to a method of fabricating a semiconductor device having a source/drain layer raised from a substrate, wherein occurrence of a low resistance connection (a short) between a source or drain layer and a gate electrode is prevented.

2. Description of the Related Art

In a miniaturized MOSFET, it has been required that a source/drain region at a surface of a substrate is formed with extremely shallow junctions in order to increase a punch-through voltage. However, only to form shallow junctions provokes deterioration in element characteristics due to increase in a parasitic resistance in the source/drain regions. Therefore, in Publication of Unexamined Japanese Patent Application No. Hei 2-222153, there is disclosed an MOSFET in which a lower resistance in a source/drain region is sought by forming a source/drain layer raised from a substrate.

FIGS. 1A to 1C are sectional views showing a method of fabricating a conventional MOSFET in successive process steps. As shown FIG. 1A, a field oxide film 302 is formed at a surface of a silicon substrate 301 by a selective oxidation method and thereby an element region is defined. An oxide film and a polycrystalline silicon film (both not shown) are successively in the order formed on the silicon substrate 301 in the element region and both films are patterned to form a gate oxide film 303 made of the oxide film and a gate electrode 304 made of the polycrystalline silicon film. An oxide film (not shown) of a thickness of 200 to 900 Å is deposited on the entire surface and then etched back by anisotropic dry etching. Thereby a first sidewall insulating film 305 made of the oxide film is formed on a side surface of the gate electrode 304.

Ions are implanted from above the substrate 301 to form a very shallow ion implanted layer 306 at the surface of the substrate 301. The ion implanted layer 306 is formed by implanting n-type ions or p-type ions in the surface of the substrate 301 with a surface concentration of $5 \times 10^{17}$ to $1 \times 10^{20}$ cm$^{-3}$.

As shown in FIG. 1B, silicon films 307a and 307b of thickness of 1000 to 2000 Å are selectively deposited on the top surfaces of the gate electrode 304 and the ion implanted layer 306 by means of a chemical vapor deposition method (CVD method).

As shown in FIG. 1C, an insulating film (not shown) made of an oxide film having a thickness of 1000 to 2000 Å is deposited on the entire surface of the substrate, the insulating film is then etched back by anisotropic dry etching. Thereby, a second sidewall insulating film 308a is formed on side surfaces of the first sidewall insulating film 305 and the silicon film 307a in a contact relation with a surface of the silicon film 307b. And a second sidewall insulating film 308b is also formed on a side surface of the silicon film 307b in a contact relation with the field oxide film 302.

As shown in FIG. 1D, an impurity is doped in a silicon film 307b on the ion implanted layer 306. Thereby a source/drain layer 310 made of the silicon layer is formed on the substrate 301, and a shallow source/drain region 309 are formed in the region where the ion implanted layer 306 is present. Such a source/drain layer 310 forms raised portions from the substrate 301. The source/grain region 309 is formed with a depth larger than each of the ion implanted layers 306 by a small difference.

A titanium silicide layer 311 is formed on the top surface of the source/drain layer 310 on the substrate 301 and on the top surface of the silicon film 307a on the gate electrode 304. The titanium silicide layer 311 is formed in such a manner that first of all, a titanium layer is deposited on the entire surface of the substrate 301 and titanium in the titanium film is reacted with silicon in the silicon layer under the titanium film in a nitrogen atmosphere. Namely, surface portions of the source/drain layer 310 on the substrate 301 and the silicon film 307a on the gate electrode 304 are reacted with titanium in the titanium layer to form the titanium silicide layer 311.

A titanium layer formed on the second sidewall insulating film 308a, 308b, and the field oxide film 302 is reacted with nitrogen in an environmental gas to form a titanium nitride layer. Therefore, if only the titanium nitride layer is selectively removed by wet etching, the titanium silicide layer 311 can be selectively formed on the top surfaces of the source/drain layers 310 and the top surface of the silicon film 307a.

However, in the case where the conventional fabrication method shown in FIG. 1 is adopted, there arises a problem that a low resistance connection is apt to occur between the gate electrode 304 and the source/drain layer 310, or between the source/drain layers 310, themselves adjacent to each other.

SAMMARY OF THE INVENTION

It is an object of the present invention to provide a method of fabricating a semiconductor device having a source/drain layer raised from a substrate, wherein occurrence of a low resistance connection between a source or drain layer and a gate electrode, and between the source and drain layers can be prevented and thereby it is possible to obtain a semiconductor device with high reliability.

In a method of fabricating a semiconductor device having a source/drain layer raised from a substrate according to the present invention comprises the step of forming a gate insulating film on a semiconductor substrate. A gate electrode is formed on the gate insulating film. A first sidewall insulating film is formed on a side surface of the gate electrode. A silicon film is grown on the semiconductor substrate and the gate electrode. The surface of the silicon film is oxidized to form a thermal oxide film. The thermal oxide film is etched back to form a second sidewall insulating film made of the thermal oxide film left behind on a side surface of the silicon film. An impurity is doped in the silicon film. The impurity has a conductivity type different from that of the semiconductor substrate. With this process step, a source/drain layer in the silicon film, wherein the source/drain layer is raised from the semiconductor substrate.

Subsequently to the step of doping the impurity in the silicon film, a refractory metal silicide film may be formed on the surface of the silicon film on the gate electrode and on the surface of the source/drain layer. This step can comprise the steps of forming a refractory metal film on the surface of the silicon film on the gate electrode and on the source/drain layer, and annealing the refractory metal film to react with silicon in the silicon film.

An impurity may be doped in the surface of the semiconductor substrate at a lower concentration than the source/ drain layer, between the steps of forming the gate electrode and forming the first sidewall insulating film. The impurity has a different conductivity type from that of the semiconductor substrate. Furthermore, an insulating film may be formed by means of a chemical vapor deposition method on the thermal oxide film, between the steps of forming the thermal oxide film and forming the second sidewall insulating film. In this case, the step of etching back the thermal oxide film may be a step of simultaneously etching back the insulating film and the thermal oxide film as one step.

The silicon film may be formed on the first sidewall insulating film in the step of forming the silicon film, and the step of forming the thermal oxide film may be performed at a condition that the silicon film on the first sidewall insulating film is perfectly thermally oxidized.

The step of doping an impurity in the silicon film may be conducted during the step of growing the silicon film or immediately, after the step of forming the silicon film.

In the case where a silicon film is selectively deposited on the top surface of the gate electrode and on the top surface of the source/drain region at the surface of the substrate by means of a chemical vapor deposition method (CVD method), the silicon film may deposit on an area other than where the surface of the silicon film is exposed according to conditions of deposition or surface conditions of the silicon substrate, that is a silicon film is sometimes deposited even on parts of the oxide film or the insulating film. Such a silicon film deposited on the oxide film or insulating film is a cause of occurrence of a low resistance connection between the gate electrode and the source or drain region and between the source/drain regions themselves. That is, if a silicon film is formed on an oxide film or insulating film, the silicon film on the oxide film or insulating film is later reacted to produce a refractory metal silicide film in the step of forming the refractory metal silicide film on the surface of the silicon film. Therefore, conductive condition is formed between a gate electrode and a source or drain region and between the source and drain regions themselves. It has not been exactly apparent why the silicon film is formed on the insulating film or oxide film, but an understanding on a cause is available that there are impurities on parts of the surfaces of the insulating film and oxide film to facilitate a formation of nuclei for silicon deposition.

Therefore, according to the present invention, a silicon film deposited on parts of the insulating film or oxide film is oxidized in a following thermal oxidation step. Thus, it can be prevented that a refractory metal silicide film is formed on the insulating film and oxide film and no low resistance connection between a gate electrode and a source or drain layer and between the source and drain layers can occur. A production of a leakage current therebetween can also be reduced. As a result, a semiconductor device having a source/drain layer raised from a substrate can be fabricated with a high reliability.

BRIEF DESCRIPTION OF THE DRAWINGS

FIGS. 1A to 1D are sectional views showing a method of fabricating a conventional MOSFET in successive process steps.

DETAILED DESCRIPTION OF THE PREFERRED EMBODIMENTS

Figure 2A:
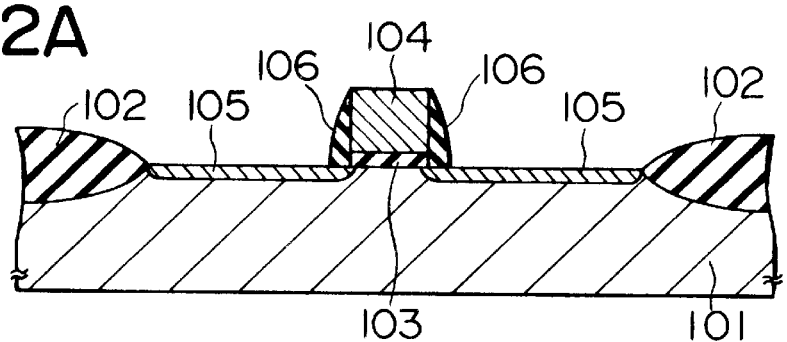
FIGS. 2A to 2D are sectional views showing a method of fabricating a semiconductor device according to a first embodiment of the present invention in successive process steps.
Figure 2B:
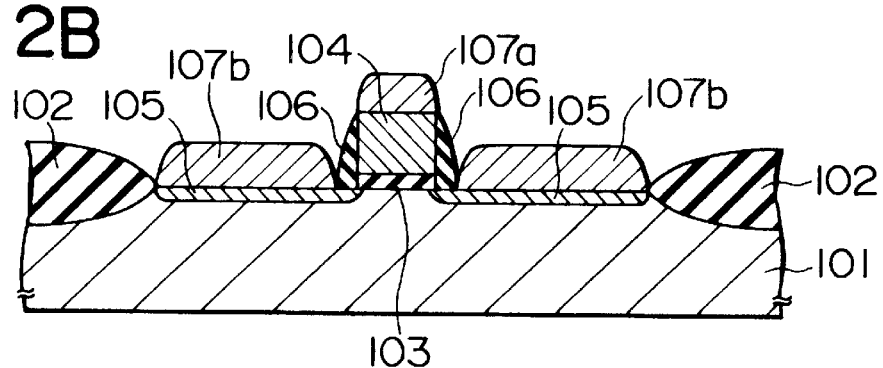
Figure 2C:
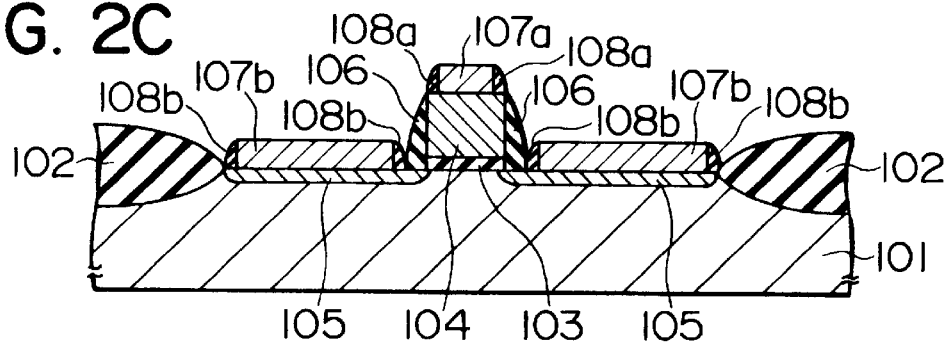

Descriptions on embodiments of the present invention will below given in reference to the accompanying drawings in a concrete manner. FIGS. 2A to 2C are the sectional views showing a method of fabricating a semiconductor device according to a first embodiment of the present invention in successive process steps. As shown in FIG. 2A, an element region is defined by forming a field oxide film 102 having a thickness of 3000 Å at a surface of a p-type silicon substrate 101 by means of a selective oxidation method. An oxide film (not shown) having a thickness of 60 Å is then formed on the surface of the p-type silicon substrate 101. Thereafter, a polycrystalline silicon film (not shown) having a thickness of 1500 Å is deposited on the entire surface of the substrate 101 and subsequently the oxide film and polycrystalline silicon film are patterned to form a gate oxide film 103 and a gate electrode film 104. Thereafter, for example, ions of an n-type impurity, such as phosphorus (P) are implanted in the surface of the substrate 101 in conditions of an acceleration energy in the range of 20 to 30 keV and a dose in the range of $1 \times 10^{13}$ to $1 \times 10^{14}$ cm$^{-2}$. A very shallow ion implanted layer 105 with a low concentration is thereby formed.

Thereafter, an oxide film (not shown) having a thickness of 800 Å on the entire surface of the substrate and the oxide film is etched back by anisotropic dry etching to form a first sidewall insulating film 106 made of the oxide film on a side surface of the gate electrode film 104.

As shown in FIG. 2B, silicon films 107a and 107b having thickness in the range of 400 to 800 Å are selectively grown on the gate electrode film 104 made of the polycrystalline silicon film and the ion implanted layers 105 by a chemical vapor deposition method (CVD). In this step, a thin silicon film (not shown) is formed on a part of the first sidewall insulating film 106, and on a part of the field oxide film 102.

Subsequently, as shown in FIG. 2C, surfaces of the silicon films 107a and 107b are thermally oxidized to form a thermal oxide film (not shown) having a thickness in the range of 200 to 400 Å. In the step of thermally oxidizing the silicon films 107a and 107b, the thin silicon films formed on part of the first sidewall insulating film 106, and on part of the field oxide film 102, are all oxidized as well. After the oxidation, the thermal oxide films are etched back by anisotropic dry etching and thus second sidewall insulating films 108a and 108b made of thermal oxide films are respectively formed on the side surfaces of the silicon film 107a on the gate electrode film 104 and the silicon film 107b on the ion implanted layers 105.

Figure 2D:
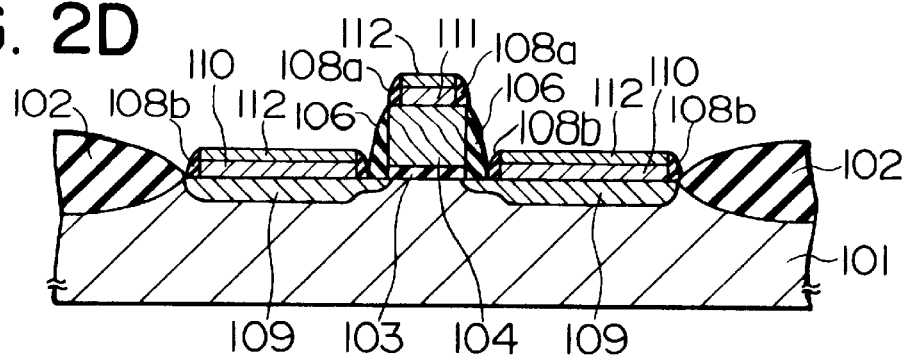

After the anisotropic dry etching, as shown FIG. 2D, ions of an n-type impurity are implanted in the surface of the substrate at an acceleration energy of ions in the range of 40 to 50 keV for a dose in the range of $1 \times 10^{15}$ to $1 \times 10^{16}$ cm$^{-2}$ from above the substrate 101. Thereby, a shallow source/drain region 109 at a high concentration is formed in the ion implanted layers 105 and a source/drain layer 110 made of the silicon film 107b is formed on the source/drain region 109. The source/drain layer 110 is a raised portion higher than the surface of the substrate. In the step of implanting ions of an n-type impurity, the impurity is simultaneously doped into the gate electrode film 104 and the silicon film 107a thereon, and thus a gate electrode is formed from the gate electrode film 104 and gate electrode film 111.

In the case where an impurity-doped silicon films 107a and 107b are formed, a method wherein, for example, phosphine (PH$_3$) or the like is added in a reaction gas in the course of deposition of the silicon films 107a and 107b may be employed instead of an ion implantation method. Thereby, a doped silicon film with an impurity concentration in the range of $1\times10^{19}$ to $1\times10^{21}$ cm$^{-3}$ is obtained. In this case, a surface part which is later transformed to a silicide of the silicon film may be formed without doping with an impurity.

After that, a titanium silicide layer 112 is formed on the top surface of the source/drain layer 110 and on the top surface of the gate electrode film 111. The titanium silicide layer 112 is formed in such a manner that a titanium film having a thickness of 300 Å is deposited on the entire surface of the substrate and then titanium in the titanium layer and silicon in the underlying layer are reacted with each other in a nitrogen atmosphere. That is, only silicon constituting the source/drain layer 110 on the substrate 101 and the gate electrode film 111 is reacted with titanium and the titanium silicide layer 112 is formed.

The titanium layer formed on the first sidewall insulating film 106, second sidewall insulating film 108a, 108b, and field oxide film 102 is reacted only with nitrogen in an atmospheric gas to form a titanium nitride layer. Therefore, if only the titanium nitride layer is selectively removed by wet etching, the titanium silicide layer 112 can selectively be formed only on the top surfaces of the source/drain layer 110 and the gate electrode film 111.

In the embodiment, a silicon film deposited on a part of the surface of an insulating film (the field oxide film 102 and the first sidewall insulating film 106) is oxidized by a later step of thermal oxidation. Therefore, it can be prevented that a refractory metal silicide film is formed on an insulating film and furthermore, not only can occurrences of a low resistance connection between a gate electrode and a source or drain layer and between the source and drain layers be prevented, but occurrence of a leakage current can also be reduced therebetween.

In general, a quantity of a silicon film deposited on an insulating film is by far less in a selective growth of the silicon film, compared with a quantity of a silicon film deposited on a silicon film. The reason why is that a density of silicon nuclei formed on an insulating film is smaller than that on a silicon film. Therefore, even if conditions that the silicon film is thermally oxidized to a depth of about 200 to 400 Å are employed, the silicon film on an insulating film can thermally be oxidized to its full thickness. In other words, even if a silicon film on an insulating film is fully oxidized, a part of a silicon film selectively grown on a silicon film is only oxidized and thus a silicon film used for formation of a source/drain layer on the substrate can be left behind as it was.

Since sidewall insulating films are formed on side surfaces of the source/drain layer 110 on the substrate and the gate electrode film 111 in the embodiment, a low resistance connection between the gate electrode film 104 or gate electrode film 110 thereon and the source/drain layer 110, which is caused by the titanium silicide layer 112 formed on side surfaces of the source/drain layer 110 on the substrate, can be prevented.

While the case where a titanium silicide layer is formed on a silicon film by use of titanium is described in the first embodiment, there is no restriction to this case according to the present invention. The present invention includes in its scope, for example, the case where a refractory metal other than titanium is used and a silicide of the refractory metal is formed on the top surfaces of a source/drain layer 110 and of a gate electrode film 111.

Figure 3A:
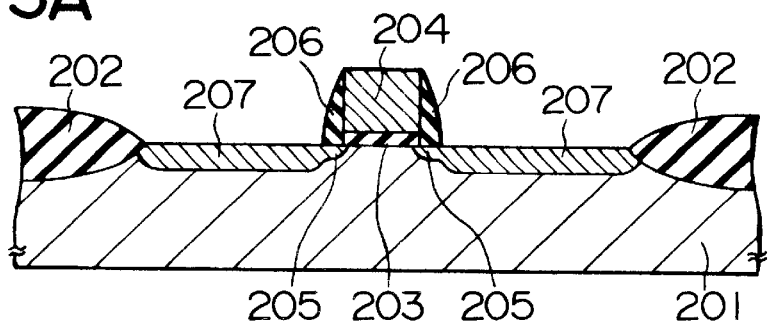
FIGS. 3A to 3D are sectional views showing a method of fabricating a semiconductor device according to a second embodiment of the present invention in successive process steps.
Figure 3B:
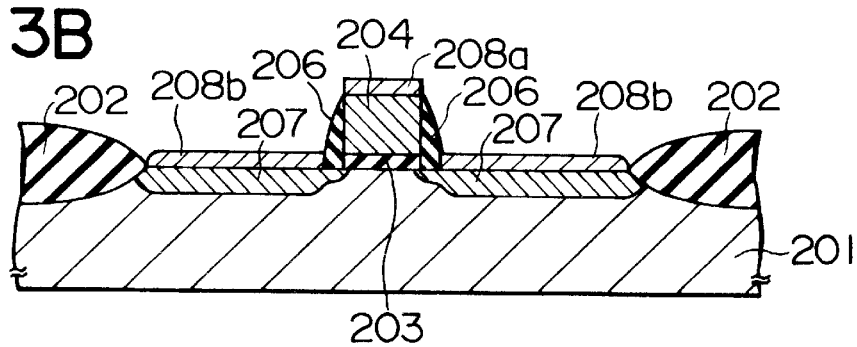
Figure 3C:
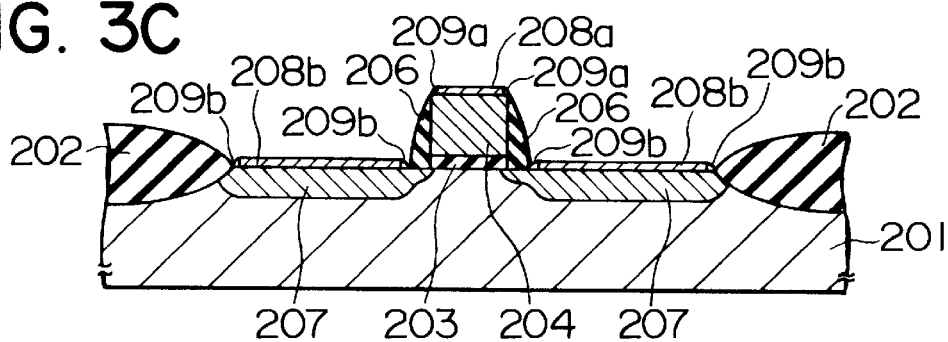

FIGS. 3A to 3C are sectional views showing a method of fabricating a semiconductor device according to a second embodiment of the present invention in successive process steps. As shown in FIG. 3A, a field oxide film 202 having a thickness of 3000 Å is formed at a surface of a p-type silicon substrate 201 by a selective oxidation method and an element region is defined. In next step, an oxide film (not shown) having a thickness of 60 Å is formed on a surface of the p-type silicon substrate 201. Thereafter, a polycrystalline silicon film (not shown) having 1500 Å is deposited on the entire surface of the substrate 201 and subsequently the oxide film and polycrystalline silicon film are patterned to form a gate oxide film 203 and gate electrode film 204. After the patterning, ions of an n-type impurity, for example phosphorus (P), are implanted in the surface of the substrate 201 at an acceleration energy of the ions in the range of 20 to 30 keV for a dose in the range of $1\times10^{13}$ to $1\times10^{14}$ cm$^{-2}$. Thereby a very shallow ion implanted layer 205 with a low concentration is formed.

After the ion implantation, an oxide film (not shown) having a thickness of 800 Å is deposited on the entire surface of the substrate 201 and the oxide film is etched back by anisotropic dry etching, so that a first sidewall insulating film 206 made of the oxide film on a side surface of the gate electrode film 204. Thereafter, ions of an n-type impurity are implanted from above the substrate 201 at an acceleration energy in the range of 30 to 40 keV for a dose in the range of $1\times10^{15}$ to $1\times10^{16}$ cm$^{-2}$. Thereby, a source/drain region 207 with a high concentration is formed in the region where the ion implanted layer 205 is formed. At this point, the n-type impurity is doped in the gate electrode film 204 as well.

Then as shown in FIG. 3B, silicon films 208a and 208b having thickness of 400 Å are grown on the gate electrode film 204 made of polycrystalline silicon and the source/drain region 207 by a chemical vapor deposition method. In this step, a thin silicon film (not shown) is formed on a part of the first sidewall insulating film 206, and on a part of the field oxide film 202.

As shown in FIG. 3C, the surfaces of the silicon films 208a and 208b, which are selectively formed, are thermally oxidized and thus a thermal oxide film (not shown) having a thickness of 200 Å is formed. Thin silicon films deposited on the part of the field oxide film 202, and on the part of the first sidewall insulating film 206, are fully oxidized in the step of thermally oxidizing the silicon film 208a, 208b, as well. The thermal oxide films are etched back by anisotropic dry etching and second sidewall insulating films 209a and 209b made of a thermal oxide film are formed on side surfaces of the silicon film 208a on the gate electrode film 204 and the silicon film 208b on the source/drain region 207. At this point, a thickness of each of the silicon films 208a and 208b is reduced to about 300 Å by the thermal oxidation and the etching-back.

Figure 3D:
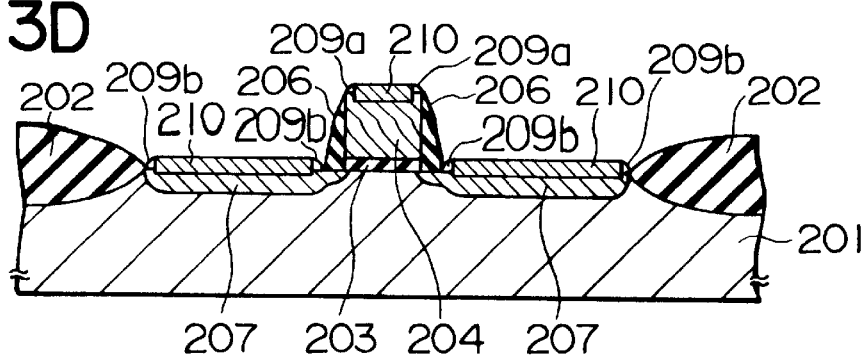

After the thermal oxidation and the etching-back, as shown in FIG. 3D, a titanium silicide layer 210 is formed through a reaction titanium with silicon in the silicon film 208a on the gate electrode film 204, a part of the surface of the gate electrode film 204, the silicon film 208b on the source/drain region 207, and a part of the surface of the source/drain region 207. Thereby, a source/drain layer (titanium silicide layer 210) in the shape of a raised portion higher than the surface of the substrate is formed on the substrate.

In the second embodiment, a source/drain region 207 having a high concentration is formed before silicon films 208a and 208b are formed, which is different from the first embodiment, and silicon films 208a and 208b are fully transformed to titanium silicide layers 210, so that the impurity is not doped in the silicon films 208a and 208b. That is, in the second embodiment, all the silicon films 208a and 208b are fully transformed to titanium silicide layers 210, the titanium silicide layer 210 and a source/drain region 207 are electrically connected with each other, and the titanium silicide layer 210 and the gate electrode film 204 are also electrically connected with each other. Therefore, thickness of the silicon films 208a and 208b are thinner, compared with that in the first embodiment.

The titanium silicide layer 210 is formed in such a manner that a titanium layer (not shown) is deposited on the entire surface of the substrate and then titanium in the titanium layer is reacted with silicon in the underlying layer in a nitrogen atmosphere. That is, only silicon constituting the silicon film 208b on the substrate 201 and the silicon film 208a on the gate electrode film 204 is reacted with titanium and the titanium silicide layer 210 having a thickness of 500 Å is formed as a result of the reaction. Since about 500 Å of a silicon film is consumed in order to form 500 Å of a titanium silicide layer, the silicon film 208a, 208b having a thickness of 300 Å is consumed to its full thickness and in addition a region from the surface to a depth of 200 Å of each of the gate electrode film 204 made of silicon and the source/drain region 207 made of silicon with a high concentration, is also consumed for formation of the titanium silicide layer 210.

A titanium layer formed on the first sidewall insulating film 206, second sidewall insulating film 209a, 209b, and field oxide film 202 is reacted with only nitrogen in a nitrogen atmosphere and a titanium nitride layer is formed. Therefore, if only the titanium nitride layer is selectively removed by wet etching, the titanium silicide layer 210 can only be formed on the top surfaces of the source/drain region 207 and the gate electrode film 204.

While in the second embodiment, titanium is used and a titanium silicide layer is formed on the gate electrode film 204 and source/drain region 207, a method of the present invention is not restricted to the case. For example, a refractory metal silicide may be formed on the surfaces of the gate electrode film 204 and source/drain region 207 by use of a refractory metal other than titanium.

Moreover, while in the second embodiment, the silicon films 208a and 208b, which are undoped, are formed, there can be, without departing from the present invention, a modification such that a gas for doping an impurity is added to a reaction gas during deposition of a silicon film and a doped silicon film is formed. Thereby, a source/drain layer formed on a substrate and a titanium silicide layer formed on the source/drain layer are obtained. In this case, a part of the surface of the silicon film, which is later transformed into a silicide, may be formed without doping with an impurity.

Modifications of the first and second embodiments can be made in the following ways. For example, in the case where source/drain regions can be formed so that the regions are extended close to a gate electrode by use of outdiffusion, ion implanted layers 105, 205 having a low concentration can be omitted.

If a thickness of a second sidewall insulating film is desired to be further thicker, the following steps may be employed: a thermal oxide film is formed on the surface of a selectively grown silicon film, thereafter, a CVD oxide film is formed on the entire surface of the substrate and subsequently the CVD oxide film and thermal oxide film are etched back. While a method of forming a n-channel MOSFET is only described in the first and second embodiments, the present invention is not limited to a n-channel MOSFET only in application, but can be applicable to a p-channel type MOSFET and CMOS FET as well.

What is claimed is:

1. A method of fabricating a semiconductor device having a source/drain layer raised from a substrate comprising the steps of:

forming a gate insulating film on a semiconductor substrate;

forming a gate electrode on said gate insulating film;

forming a first sidewall insulating film on a side surface of said gate electrode;

growing a silicon film on said semiconductor substrate and on said gate electrode;

forming a thermal oxide film by oxidizing a surface of said silicon film;

forming a second sidewall insulating film made of said thermal oxide film left behind on a side surface of said silicon film by etching back of said thermal oxide film; and doping in said silicon film with an impurity of a conductivity type different from that of said semiconductor substrate, to form a source/drain layer in said silicon film, wherein said source/drain layer is raised from said semiconductor substrate.

2. A method of fabricating a semiconductor device according to claim 1, further comprising the step of forming a refractory metal silicide film on the surface of said silicon film on said gate electrode and on the surface of said source/drain layer, after said step of doping said silicon film with said impurity.

3. A method of fabricating a semiconductor device according to claim 2, wherein said step of forming said refractory metal silicide film comprises the steps of: forming a refractory metal film on the surface of said silicon film on said gate electrode and on the surface of said source/drain layer; and annealing said refractory metal film to react with silicon in said silicon film.

4. A method of fabricating a semiconductor device according to claim 1, wherein said step of forming said first sidewall insulating film comprises the steps of: depositing an insulating film on said semiconductor substrate; and etching back said insulating film.

5. A method of fabricating a semiconductor device according to claim 1, further comprising the step of doping an impurity in the surface of said semiconductor substrate at a lower concentration than said source/drain layer, said impurity having a conductivity type different from that of said semiconductor substrate, between the steps of forming said gate electrode and forming said first sidewall insulating film.

6. A method of fabricating a semiconductor device according to claim 1, further comprising the step of forming an insulating film by means of a chemical vapor deposition method on said thermal oxide film, between the steps of forming said thermal oxide film and forming said second sidewall insulating film, and said step of etching back said thermal oxide film is a step of simultaneously etching back said insulating film and said thermal oxide film as one step.

7. A method of fabricating a semiconductor device according to claim 1, wherein said silicon film is formed on said first sidewall insulating film in said step of growing said silicon film, and said step of forming said thermal oxide film is performed at a condition that said silicon film on said first sidewall insulating film is perfectly thermally oxidized.

8. A method of fabricating a semiconductor device having a source/drain layer raised from a substrate comprising the steps of:

forming a gate insulating film on a semiconductor substrate;

forming a gate electrode on said gate insulating film;

forming a first sidewall insulating film on a side surface of said gate electrode;

growing a silicon film on said semiconductor substrate and on said gate electrode;

doping in said silicon film with an impurity of a conductivity type different from that of said semiconductor substrate, to form a source/drain layer in said silicon film, wherein said source/drain layer is raised from said semiconductor substrate;

forming a thermal oxide film by oxidizing a surface of said silicon film on said gate electrode and a surface of said source/drain layer; and forming a second sidewall insulating film made of said thermal oxide film left behind on a side surface of said silicon film on said gate electrode and a side surface of said source/drain layer by etching back of said thermal oxide film.

9. A method of fabricating a semiconductor device according to claim 8, further comprising the step of forming a refractory metal silicide film on the surface of said silicon film on said gate electrode and the surface of said source/drain layer, after said step of forming said second sidewall insulating film.

10. A method of fabricating a semiconductor device according to claim 9, wherein said step of forming said refractory metal silicide film comprises the steps of: forming a refractory metal film on the surface of said silicon film on said gate electrode and on the surface of said source/drain layer; and annealing said refractory metal film to react with silicon in said silicon film.

11. A method of fabricating a semiconductor device according to claim 8, wherein said step of forming said first sidewall insulating film comprises the steps of: depositing an insulating film on said semiconductor substrate; and etching back said insulating film.

12. A method of fabricating a semiconductor device according to claim 8, further comprising the step of doping an impurity in the surface of said semiconductor substrate at a lower concentration than said source/drain layer, said impurity having a conductivity type different from that of said semiconductor substrate, between said steps of forming said gate electrode and forming said first sidewall insulating film.

13. A method of fabricating a semiconductor device according to claim 8, further comprising the step of forming an insulating film by means of a chemical vapor deposition method on said thermal oxide film, between the steps of forming said thermal oxide film and forming said second sidewall insulating film, and said step of etching back said thermal oxide film is a step of simultaneously etching back said insulating film and said thermal oxide film as one step.

14. A method of fabricating a semiconductor device according to claim 8, wherein said silicon film is formed on said first sidewall insulating film in said step of growing said silicon film, and said step of forming said thermal oxide film is performed at a condition that said silicon film on said first sidewall insulating film is perfectly thermally oxidized.

15. A method of fabricating a semiconductor device having a source/drain layer raised from a substrate comprising the steps of:

forming a gate insulating film on a semiconductor substrate;

forming a gate electrode on said gate insulating film;

forming a first sidewall insulating film on a side surface of said gate electrode;

growing a silicon film doped with an impurity of a conductivity type different from that of said semiconductor substrate on said semiconductor substrate and said gate electrode, to form a source/drain layer by said silicon film, wherein said source/drain layer is raised from said semiconductor substrate;

forming a thermal oxide film by oxidizing a surface of said silicon film on said gate electrode and a surface of said source/drain layer; and forming a second sidewall insulating film made of said thermal oxide film left behind on a side surface of said silicon film on said gate electrode and a side surface of said source/drain layer by etching back of said thermal oxide film.

16. A method of fabricating a semiconductor device according to claim 15, further comprising the step of forming a refractory metal silicide film on the surface of said silicon film on said gate electrode and the surface of said source/drain layer, after said step of forming said second sidewall insulating film.

17. A method of fabricating a semiconductor device according to claim 16, wherein said step of forming said refractory metal silicide film comprises the steps of: forming a refractory metal film on the surface of said silicon film on said gate electrode and on the surface of said source/drain layer; and annealing said refractory metal film to react with silicon in said silicon film with refractory metal in said refractory metal film.

18. A method of fabricating a semiconductor device according to claim 15, wherein said step of forming said first sidewall insulating film comprises the steps of: depositing an insulating film on said semiconductor substrate; and etching back said insulating film.

19. A method of fabricating a semiconductor device according to claim 15, further comprising the step of doping an impurity in the surface of said semiconductor substrate at a lower concentration than said source/drain layer, said impurity having a conductivity type different from that of said semiconductor substrate, between the steps of forming said gate electrode and forming said first sidewall insulating film.

20. A method of fabricating a semiconductor device according to claim 15, further comprising the step of forming an insulating film by means of a chemical vapor deposition method on said thermal oxide film, between the steps of forming said thermal oxide film and forming said second sidewall insulating film, and said step of etching back said thermal oxide film is a step of simultaneously etching back said insulating film and said thermal oxide film as one step.

21. A method of fabricating a semiconductor device according to claim 15, wherein said silicon film is formed on said first sidewall insulating film in said step of growing said silicon film, and said step of forming said thermal oxide film is performed at a condition that said silicon film on said first sidewall insulating film is perfectly thermally oxidized.

22. A method of fabricating a semiconductor device having a source/drain layer raised from a substrate comprising the steps of:

forming a gate insulating film on a semiconductor substrate;

forming a gate electrode on said gate insulating film;

forming a first sidewall insulating film on a side surface of said gate electrode;

forming a source/drain region at a surface of said semiconductor substrate by doping in the surface of said semiconductor substrate with an impurity of a conductivity type different from that of said semiconductor substrate with said gate electrode and said first sidewall insulating film as a mask;

growing a silicon film on said source/drain region and said gate electrode;

forming a thermal oxide film by oxidizing a surface of said silicon film;

forming a second sidewall insulating film made of said thermal oxide film left behind on a side surface of said silicon film by etching back said thermal oxide film;

forming a refractory metal silicide film on the surface of said silicon film, to form a source/drain layer by said refractory metal silicide film, wherein said source/drain layer is raised from said semiconductor substrate.

23. A method of fabricating a semiconductor device according to claim 22, wherein said step of forming said refractory metal silicide film comprises the steps of: forming a refractory metal film on the surface of said silicon film; and annealing said refractory metal film to react with silicon in said silicon film with refractory metal in said refractory metal film.

24. A method of fabricating a semiconductor device according to claim 23, wherein said silicon film is fully transformed into said refractory metal silicide film in said step of annealing said refractory metal film.

25. A method of fabricating a semiconductor device according to claim 22, wherein said step of growing said silicon film comprises the step of doping in said silicon film with an impurity of a different conductivity type from that of said semiconductor substrate.

26. A method of fabricating a semiconductor device according to claim 25, wherein said impurity is doped throughout the entire bulk of said silicon film.

27. A method of fabricating a semiconductor device according to claim 25, wherein said impurity is doped in an area of said silicon film other than where silicon is reacted with a refractory metal.

28. A method of fabricating a semiconductor device according to claim 22, further comprising the step of doping an impurity in the surface of said semiconductor substrate at a lower concentration than said source/drain layer, said impurity having a conductivity type different from that of said semiconductor substrate, between said steps of forming said gate electrode and forming said first sidewall insulating film.

29. A method of fabricating a semiconductor device according to claim 22, further comprising the step of forming an insulating film by means of a chemical vapor deposition method on said thermal oxide film, between said steps of forming said thermal oxide film and forming said second sidewall insulating film, and said step of etching back said thermal oxide film is a step of simultaneously etching back said insulating film and said thermal oxide film as one step.

* * * * *